United States Patent
Huang et al.

(10) Patent No.: US 7,191,822 B2
(45) Date of Patent: Mar. 20, 2007

(54) ALUMINUM EXTRUDED FIN SET WITH NOISE REDUCTION FUNCTIONALITY

(75) Inventors: Yu-Nien Huang, Chung Li (TW); Shun-Ta Yu, Taipei (TW); Cheng-Yu Wang, Hsinchu (TW); Jim-Fat Tseng, Kaohsiung (TW)

(73) Assignee: Quanta Computer Inc., Tao Yuan Shien (TW)

( * ) Notice: Subject to any disclaimer, the term of this patent is extended or adjusted under 35 U.S.C. 154(b) by 0 days.

(21) Appl. No.: 11/105,466

(22) Filed: Apr. 14, 2005

(65) Prior Publication Data
US 2005/0284608 A1    Dec. 29, 2005

(30) Foreign Application Priority Data
Jun. 28, 2004    (TW) ............................... 93118817 A

(51) Int. Cl.
*F28F 13/00* (2006.01)
(52) U.S. Cl. ............. 165/80.3; 165/185; 165/DIG. 529
(58) Field of Classification Search ...... 165/80.1–80.3, 165/185, DIG. 529, DIG. 518
See application file for complete search history.

(56) References Cited

U.S. PATENT DOCUMENTS

| | | | | |
|---|---|---|---|---|
| 5,406,451 A | * | 4/1995 | Korinsky | 165/80.3 |
| 5,435,384 A | * | 7/1995 | Wu | 165/185 |
| 5,518,071 A | * | 5/1996 | Lee | 165/185 |
| 5,594,623 A | * | 1/1997 | Schwegler | 165/185 |
| 5,726,495 A | * | 3/1998 | Aihara et al. | 165/80.3 |
| 6,267,178 B1 | * | 7/2001 | Chen | 165/185 |
| 6,675,885 B2 | * | 1/2004 | Kuo | 165/185 |
| 6,735,082 B2 | * | 5/2004 | Self | 165/80.3 |

* cited by examiner

Primary Examiner—Teresa J. Walberg
(74) Attorney, Agent, or Firm—Rabin & Berdo, PC

(57) ABSTRACT

An aluminum extruded fin set includes a substrate and a plurality of dissipation fins mounted upright on it. There are gaps between heat dissipation fins. Each dissipation fin is divided into three child dissipation fins by two slanted cutouts. The child dissipation fin between two slanted cutouts is bent toward the gap between heat dissipation fins. When airflow passes by the gaps, the airflow velocity distribution is modified due to the bent child dissipation fins and the noise spectrum distribution is modified as well. Such a Hay-stack noise spectrum distribution is more comfortable for the listener than a conventional one.

9 Claims, 4 Drawing Sheets ion as claimed.

ALUMINUM EXTRUDED FIN SET WITH NOISE REDUCTION FUNCTIONALITY

RELATED APPLICATIONS

The present application is based on, and claims priority from, Taiwan Application Serial Number 93118817, filed Jun. 28, 2004, the disclosure of which is hereby incorporated by reference herein in its entirety.

BACKGROUND

1. Field of Invention

The present invention relates to an aluminum extruded fin set. More particularly, the present invention relates to an aluminum extruded fin set with noise reduction functionality installed in a notebook computer.

2. Description of Related Art

As notebook PCs become thinner, there is less and less space for heat convection and heat dissipation design inside the case housing of the notebook PC. When it comes to high-frequency components, such as the CPU (central processing unit) and graphics processing chip, the heat dissipation design hits a bottleneck. Thus, the mainstream framework of heat dissipation design is to enhance average convection co-efficiency between heat dissipation and a centrifugal fan by increasing airflow output of the centrifugal fan.

FIG. 1A illustrates a perspective view of a conventional aluminum extruded fin set. When a cooling air 22 passes by a conventional aluminum extruded fin set 20 as illustrated in FIG. 1A, a Poiseuille airflow 24 is created. Such a Poiseuille airflow 24 can generate a noise spectrum distribution 26 as illustrated in FIG. 1B. The higher a summit point 26a of the noise spectrum distribution 24 that is generated, the more uncomfortable the noise that is created.

When heat dissipation efficiency is enhanced, airflow is essentially accelerated. The stronger the airflow is, the more turbulent and noisy the wake flow is. Thus, a notebook PC manufacturer faces a challenge between noise and heat dissipation efficiency.

SUMMARY

It is therefore an objective of the present invention to provide an aluminum extruded fin set with noise reduction functionality.

In accordance with the foregoing and other objectives of the present invention, an aluminum extruded fin set includes a substrate and a plurality of dissipation fins mounted upright on it. There are gaps between heat dissipation fins. Each dissipation fin is divided into three child dissipation fins by two slanted cutouts. The child dissipation fin between two slanted cutouts is bent toward the gap between heat dissipation fins. When airflow passes by the gaps, the airflow velocity distribution is modified due to the bent child dissipation fin and the noise spectrum distribution is modified as well. Such a Hay-stack noise spectrum distribution is more comfortable for the listener than a conventional one.

Thus, the aluminum extruded fin set of the present invention resolves the issue between noise and heat dissipation efficiency with low cost and without increasing fin set size.

It is to be understood that both the foregoing general description and the following detailed description are by examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
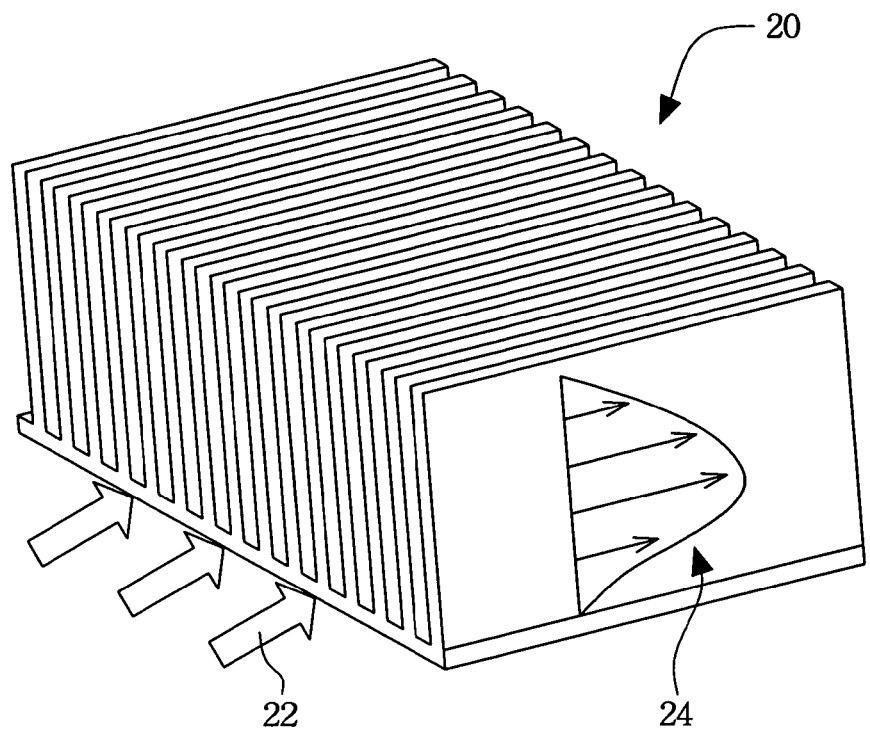
FIG. 1A illustrates a perspective view of a conventional aluminum extruded fin set.

Reference will now be made in detail to the present preferred embodiments of the invention, examples of which are illustrated in the accompanying drawings. Wherever possible, the same reference numbers are used in the drawings and the description to refer to the same or like parts.

In order to resolve the issue between noise and heat dissipation efficiency, preferred embodiments of the present invention provide an aluminum extruded fin set. Cutouts are formed on each aluminum dissipation fin to divide the fin into separate parts. One of the separate parts is bent towards an adjacent gap to modify airflow speed distribution so that a noise spectrum distribution is modified as well.

Figure 2A:
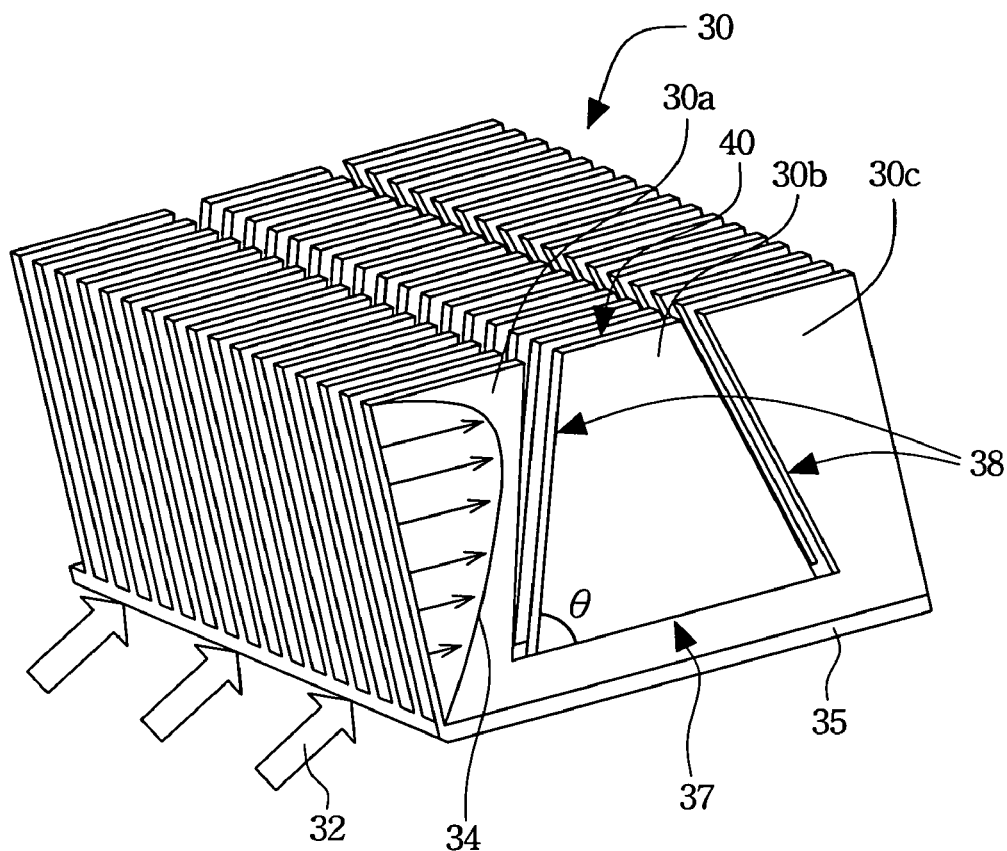
FIG. 2A illustrates a perspective view of an aluminum extruded fin set according to one preferred embodiment of this invention.

FIG. 2A illustrates a perspective view of an aluminum extruded fin set according to one preferred embodiment of this invention. In comparison with the conventional aluminum extruded fin set illustrated in FIG. 1A, slanted cutouts 38 are formed on each aluminum dissipation fin of an aluminum extruded fin set 30 in FIG. 2A. It is preferred that two adjacent slanted cutouts 38 extend to form an inverse V-shaped pattern.

Slanted cutouts 38 (and the bent line 37) roughly divide each aluminum dissipation fin into three separate (or child) dissipation fins 30a, 30b and 30c. The separate (or child) dissipation fin 30b is bent (the bent line 37 serves as a pivot axis) towards an adjacent gap 40 (any one of two adjacent gaps of the separate dissipation fin 30b). The separate (or child) dissipation fin 30b is bent so as not to contact adjacent separate (or child) dissipation fins across the gap 40. When an airflow 32 passes by the gap 40, it is interfered with by the separate (or child) dissipation fin 30b so that an airflow speed distribution 34 is generated and a Hay-stack noise spectrum distribution is created as well. Such a dissipation fin set design both enhances average convection co-efficiency and reduces noise. Regardless of whether a laminar or turbulent airflow passes by, the bent dissipation fin can interfere with its airflow speed distribution so as to obtain a Hay-stack noise spectrum distribution. When two adjacent slanted cutouts 38 extend to form an inverse V-shaped pattern, a better Hay-stack noise spectrum distribution can be obtained. Slanted cutouts entail an angle θ between the slanted cutout 38 and a surface of a substrate 35 being less than 90 degrees.

Figure 1B:
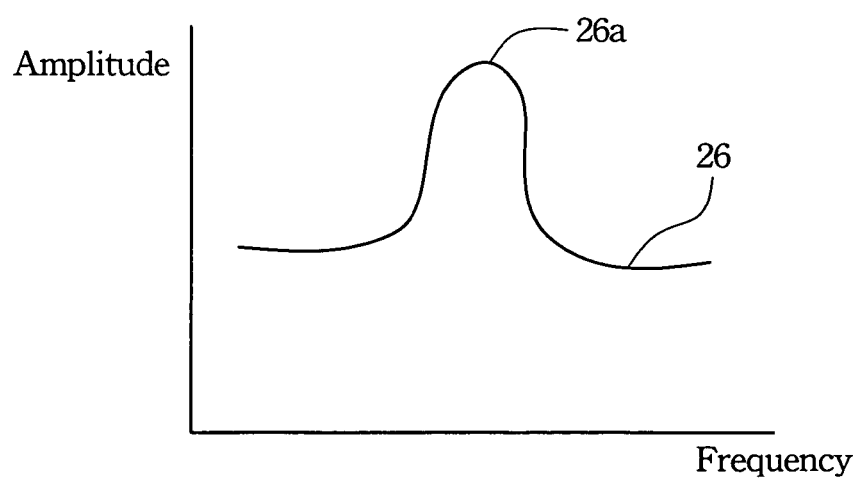
FIG. 1B illustrates a noise spectrum distribution of the conventional aluminum extruded fin set of FIG. 1A.
Figure 2B:
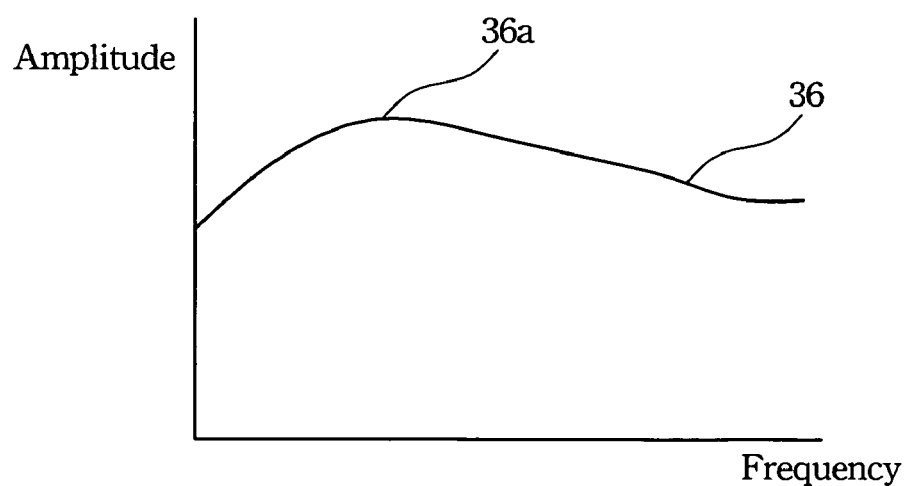
FIG. 2B illustrates a noise spectrum distribution of the aluminum extruded fin set of FIG. 2A.

FIG. 2B illustrates a noise spectrum distribution of the aluminum extruded fin of FIG. 2A. In comparison with the noise spectrum distribution 26 illustrated in FIG. 1B, the noise spectrum distribution 36 created by the airflow speed distribution 34, has a smooth distribution 36 and a lower summit point 36a. Such a noise spectrum distribution 36, generated by the aluminum extruded fin set 30, can reduce noise.

Figure 3:
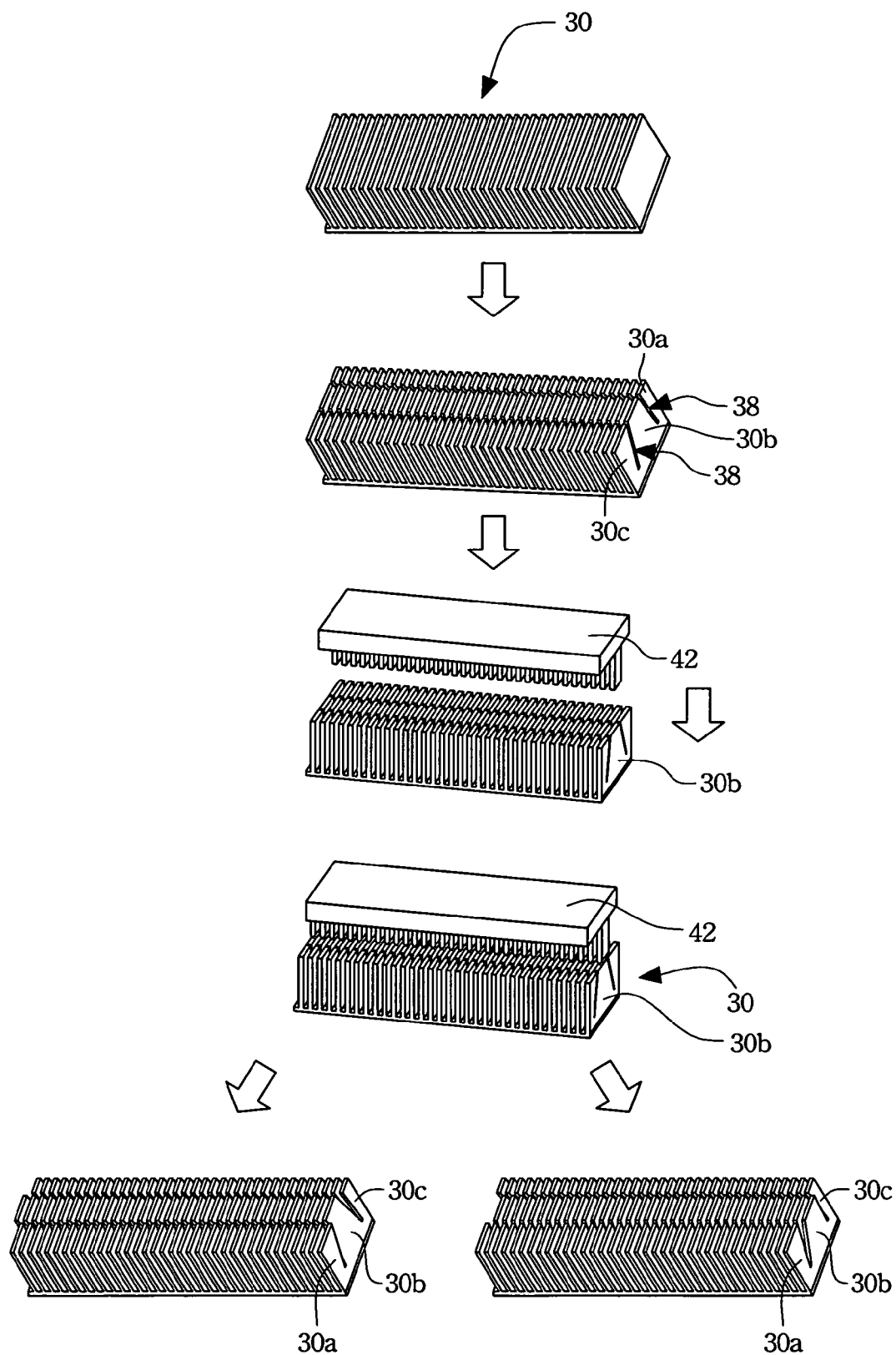
FIG. 3 illustrates a flow chart of an aluminum extruded fin set manufacturing process according to one preferred embodiment of this invention.

FIG. 3 illustrates a flow chart of an aluminum extruded fin manufacturing process according to one preferred embodiment of this invention. The first step is to form two cutouts 38 on a an aluminum extruded fin set 30 so as to divide the fin set 30 into three separate (or child) dissipation fins 30a, 30b and 30c. The second step is to bend the separate (or child) dissipation fins 30b by means of a bending tool 42. The separate (or child) dissipation fins 30b can be bent to the right (as illustrated in the lower right of FIG. 3) or the left (as illustrated in the lower left of FIG. 3).

Figure 4:
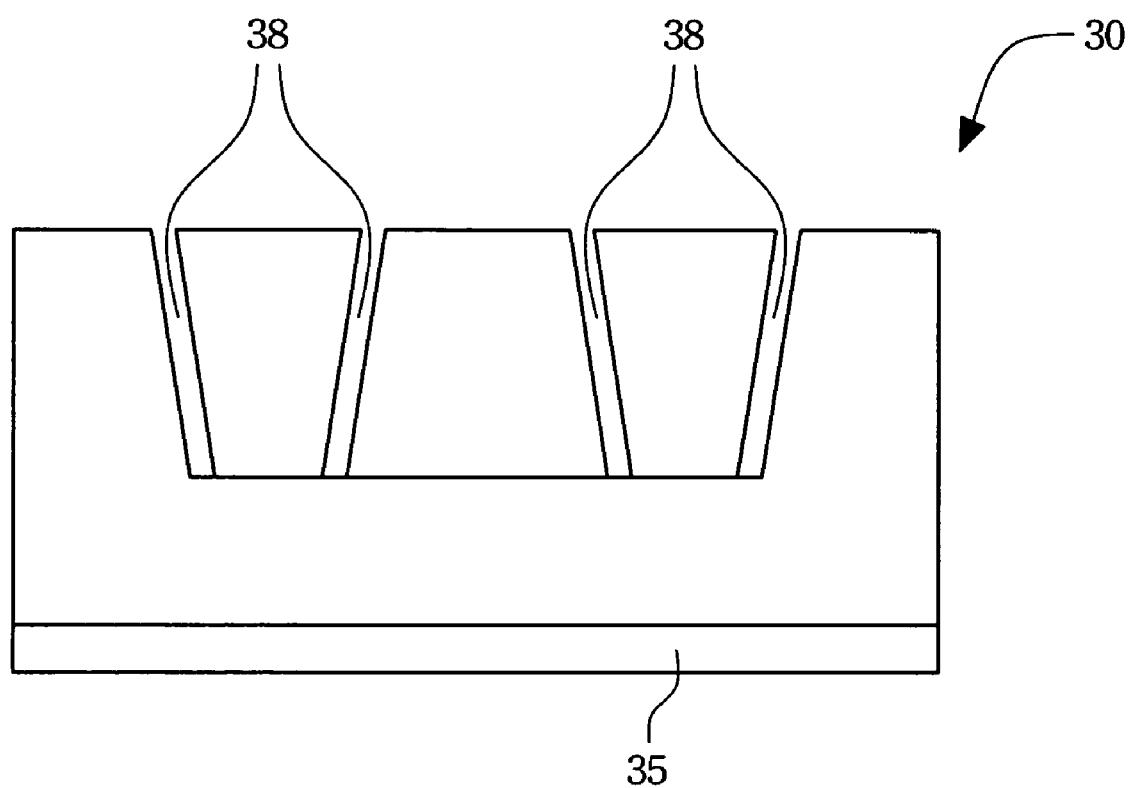
FIG. 4 illustrates a W-shaped pattern of slanted cutouts on an aluminum extruded fin set according to another preferred embodiment of this invention.

The above-mentioned slanted cutouts 38 can vary according to a length of the aluminum extruded fin set 30. The angle θ can be increased on a longer aluminum extruded fin set 30, and the angle θ can be decreased on a shorter aluminum extruded fin set 30. More slanted cutouts 38 can be formed on a longer aluminum extruded fin set 30 as well, designed such as a W-shaped pattern as illustrated in FIG. 4.

According to the preferred embodiments of present invention, the aluminum extruded fin set resolves the issue between noise and heat dissipation efficiency with low cost and without increasing fin set size.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An aluminum extruded fin set, comprising:
   a substrate;
   a plurality of aluminum dissipation fins, extending upright from said substrate, wherein a gap exists between each of said aluminum dissipation fins to serve as an airflow channel for cooling air; and
   at least one slanted cutout, removed from said aluminum dissipation fins, each of said aluminum dissipation fins being divided into at least two separate parts by said slanted cutout, wherein two adjacent separate parts divided by said slanted cutout are misaligned.

2. The aluminum extruded fin set of claim 1, wherein an angle between said slanted cutout and a surface of said substrate is less than 90 degrees.

3. An aluminum extruded fin set, comprising:
   a substrate;
   a plurality of aluminum dissipation fins, extending upright from said substrate, wherein a gap exists between each of said aluminum dissipation fins to serve as an airflow channel for cooling air; and
   at least two child aluminum dissipation fins, belonging to each of said aluminum dissipation fins, wherein at least one of said child aluminum dissipation fins is trapezoid-shaped and bent towards the airflow channel.

4. An aluminum extruded fin set, comprising:
   a substrate;
   a plurality of aluminum dissipation fins, extending upright from said substrate, wherein a gap exists between each of said aluminum dissipation fins to serve as an airflow channel for cooling air; and
   at least one slanted cutout, removed from said aluminum dissipation fins, each of said aluminum dissipation fins being divided into at least two separate parts by said slanted cutout, wherein at least one of the separate parts is trapezoid-shaped.

5. The aluminum extruded fin set of claim 4, wherein an angle between said slanted cutout and a surface of said substrate is less than 90 degrees.

6. The aluminum extruded fin set of claim 4, wherein one of said separate parts is bent towards the airflow channel for cooling air.

7. The aluminum extruded fin set of claim 4, wherein a separate part between two adjacent slanted cutouts is bent towards the airflow channel for cooling air.

8. The aluminum extruded fin set of claim 4, wherein two adjacent slanted cutouts extend to from an inverse V-shaped pattern.

9. The aluminum extruded fin set of claim 4, wherein four adjacent slanted cutouts extend to form a W-shaped pattern.

* * * * *